United States Patent [19]
Livesay

[11] 3,958,132
[45] May 18, 1976

[54] SLOPE CHANGE DETECTOR

[75] Inventor: Robert H. Livesay, West Chester, Pa.

[73] Assignee: Sun Oil Company of Pennsylvania, Philadelphia, Pa.

[22] Filed: Apr. 25, 1974

[21] Appl. No.: 464,012

[52] U.S. Cl. .............................. 307/231; 307/235 A; 328/114; 328/132
[51] Int. Cl.² ............................................ H03K 5/18
[58] Field of Search ............ 307/231, 235 R, 235 A, 307/236, 318; 328/114–118, 132, 150, 151

[56] References Cited
UNITED STATES PATENTS
3,564,287  2/1971  Todd .............................. 307/235 R

*Primary Examiner*—John Zazworsky
*Attorney, Agent, or Firm*—Donald R. Johnson; Macka L. Murrah

[57] ABSTRACT

A slope change detector circuit uses a differential amplifier to produce an output signal having two levels, the change of one to the other of which is indicative of a slope change in an input electrical signal. A first input of the differential amplifier communicates directly with a signal source, while a second input communicates with a signal source through a delay network. The delay network includes a switching circuit between the signal source and the differential amplifier comprising a field-effect-transistor and a capacitor; and a feed back circuit comprising a circuit that derives the absolute value of the differential amplifier's output signal and a level detecting zener diode that causes the field effect transistor to change resistance when the absolute value signal reaches a predetermined level.

9 Claims, 6 Drawing Figures

SLOPE CHANGE DETECTOR

BACKGROUND OF THE INVENTION

The invention relates to detecting a change in the polarity of the slope of an electrical signal.

The analysis of many physical processes often requires determination of the slope of an electrical signal that represents an aspect of the process. In gas chromotography a gas containing molecules of different sizes is injected into one end of a long, dust-filled cavity. The gas molecules travel through the cavity toward the other end where a detector is located. During transit the larger molecules collide with a greater number of dust particles than the smaller molecules, and the smaller molecules thus reach the detector first. The dust chamber causes molecules of the same size to travel together in groups, the group composed of the smallest molecules arriving at the detector first, followed by the next larger molecules, until finally the largest molecules reach the detector. The detector measures the number of molecules arriving at each instant of time and produces a continuous electrical signal having a time dependent series of peaks and valleys. The peaks represent the groups of molecules of the various sizes, and the lowest points in the valleys indicate the end of one group of molecules and the beginning of a group of larger molecules. At such a valley in the signal, the slope changes from negative to positive. Thus, the beginning of a new group of molecules whose size is larger than the preceding group can be determined by detecting a change in a signal slope from positive to negative.

One common circuit used to detect changes in slope is described in the ELECTRONIC CIRCUIT MANUAL By John Marcus (McGraw-Hill, 1971), at page 202. The detector has as its primary element a differential amplifier having a positive and a negative input. The negative input connects directly to the signal being analyzed, while the positive input communicates with the signal through a delay network. The delay network comprises a resistor and a capacitor. According to well-known principles, the signal entering the positive input will thus be delayed by an amount proportional to the product of the value of the resistor and the value of the capacitor. The differential amplifier thus sees at each input the signal being analyzed, but the signal to the positive input is delayed by a small amount of time. Thus, the signal level at the positive input will lag behind the level at the negative input. The result will be a voltage differential between the two inputs that will be amplified and appear at the output of the differential amplifier. The output will be a two-level signal which exhibits a positive voltage level when the signal at the negative input of a differential amplifier is larger than that at the positive and a negative voltage when the signal at the positive input is larger than that at the negative. When the two signals are equal, there will be a zero output voltage level. The time at which the two input levels are equal represents the point in the signal at which the slope changes. For example, assuming an input signal that is initially increasing and thus has a positive slope, the positive input of a differential amplifier will be lower than the negative input until the signal reaches a peak and begins to decrease in level. Thus, while the positive input is still increasing the negative input will be decreasing, and after the delay period of the lag network the two input signals will be equal.

Due to the nature of the delay method of detecting a change in slope, the point at which the output of the differential amplifier reaches the zero voltage level, will follow the actual change in slope by an amount of time imposed by the delay network. The delay in the prior art circuit is unacceptably large for some applications, resulting in indications of slope changes being given long after the changes have occurred. It is thus desirable to have a delay network in a slope change detector that is capable of producing a shorter and much more precisely controlled delay.

It is therefore an object of the present invention to provide a slope change detector having the above characteristics.

SUMMARY OF THE INVENTION

With this and other objects in view, the invention contemplates a device which generates a signal indicative of a relationship between a subject signal and a signal derived from the subject signal and controls access of the subject signal to the device in response to an aspect of the relationship signal.

BRIEF DESCRIPTION OF THE DRAWINGS

The invention may be more fully understood by referring to the theory of the invention and the exemplary embodiments illustrated in the following drawings.

THEORY OF THE INVENTION

Figure 1:
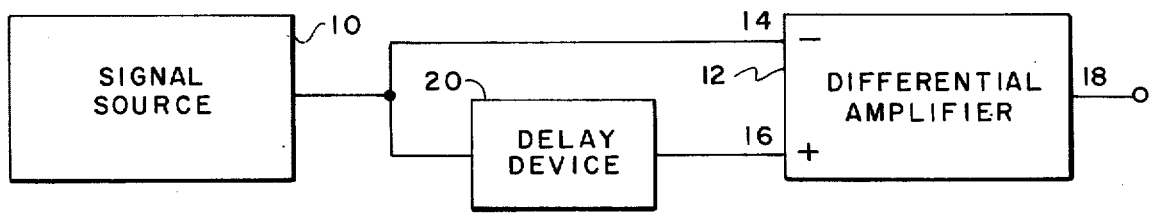
FIG. 1 is a block diagram of a simple slope change detector operating upon the delay principle.
Figure 2A:
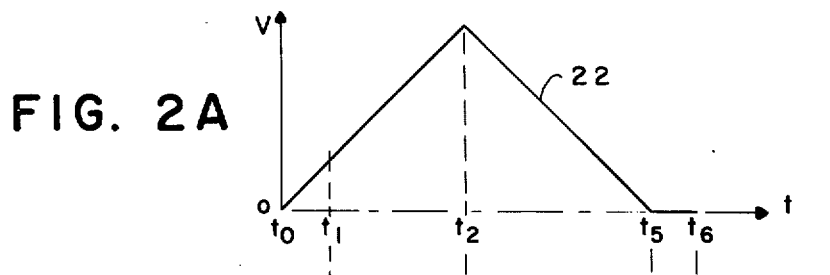
FIG. 2 is a series of waveforms that illustrate the operation of a slope change detector shown in FIG. 1.
Figure 2B:
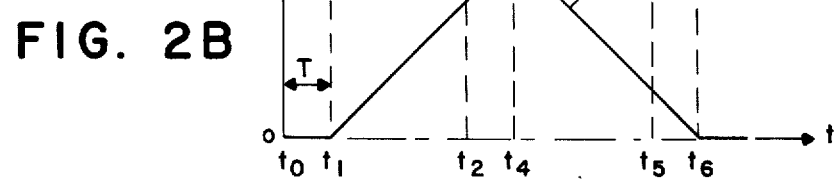
Figure 2C:
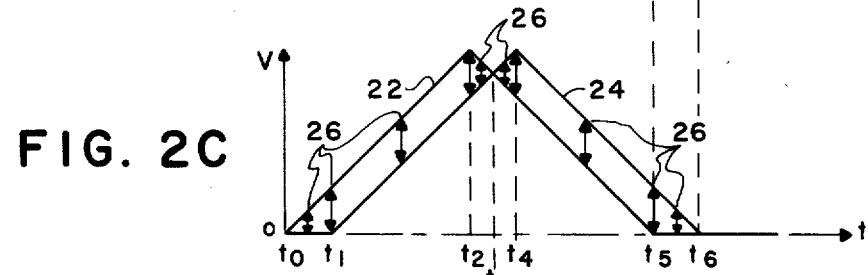

In FIG. 1, a signal source 10 provides a signal such as waveform 22 in FIG. 2A to a differential amplifier 12 at input terminals 14 and 16. The signal going to terminal 14 is uninterrupted and arrives in the form shown in FIG. 2A. However, the signal going to terminal 16 is delayed by a delay device 20 to produce waveform 24 in FIG. 2B. The delay is shown as $T = t_1 - t_0$. The delay produces a difference between the amplitudes of the signals entering the terminals 14 and 16 as shown by arrows 26 in FIG. 2C, in which waveforms 22 and 24 are superimposed upon each other.

Figure 2D:
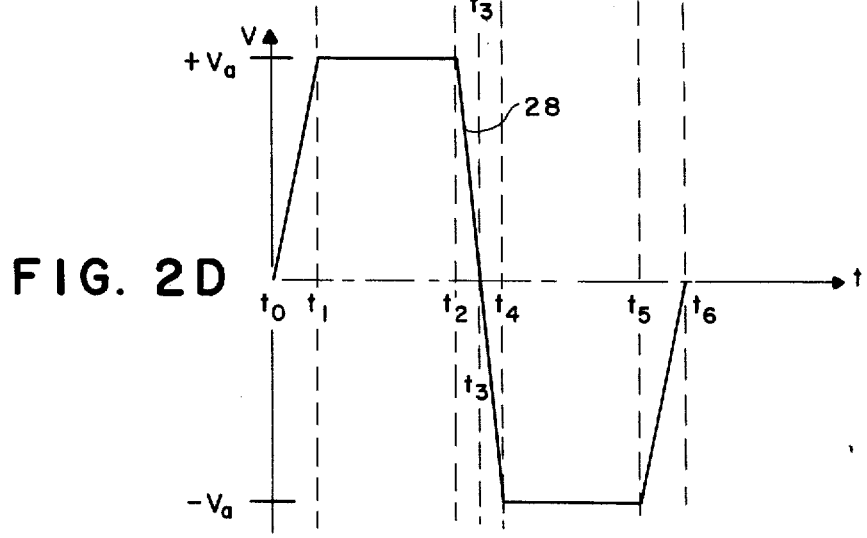

Differential amplifier 12 produces an output signal at terminal 18, as illustrated by a waveform 28 in FIG. 2D, which represents the difference between amplitudes of waveforms 22 and 24. The difference increases from zero at time $t_0$ to a positive maximum at time $t_1$. Between times $t_1$ and $t_2$ the difference remains constant, but at time $t_2$ it begins to diminish until it reaches zero again at time $t_3$. At time $t_3$ the difference changes polarity and again increases from zero to a negative maximum at time $t_4$. It remains constant until time $t_5$ when it begins to decrease, finally reaching zero at time $t_6$.

Assuming that waveform 24 is subtracted from waveform 22, waveform 28 has a positive lobe when the slope of waveform 22 is positive and a negative lobe when the slope is negative. From this it is clear that the polarity of slope of an unknown waveform can be determined from the polarity of the lobes of the waveform that appear at output terminal 18 of differential amplifier 12 and the time at which the slope changes polarity from the crossover point between the lobes. The output waveform, as can be seen in FIG. 2D approaches a square wave and will more nearly do so as delay T approaches zero.

DESCRIPTION OF THE PREFERRED EMBODIMENT

Figure 3:
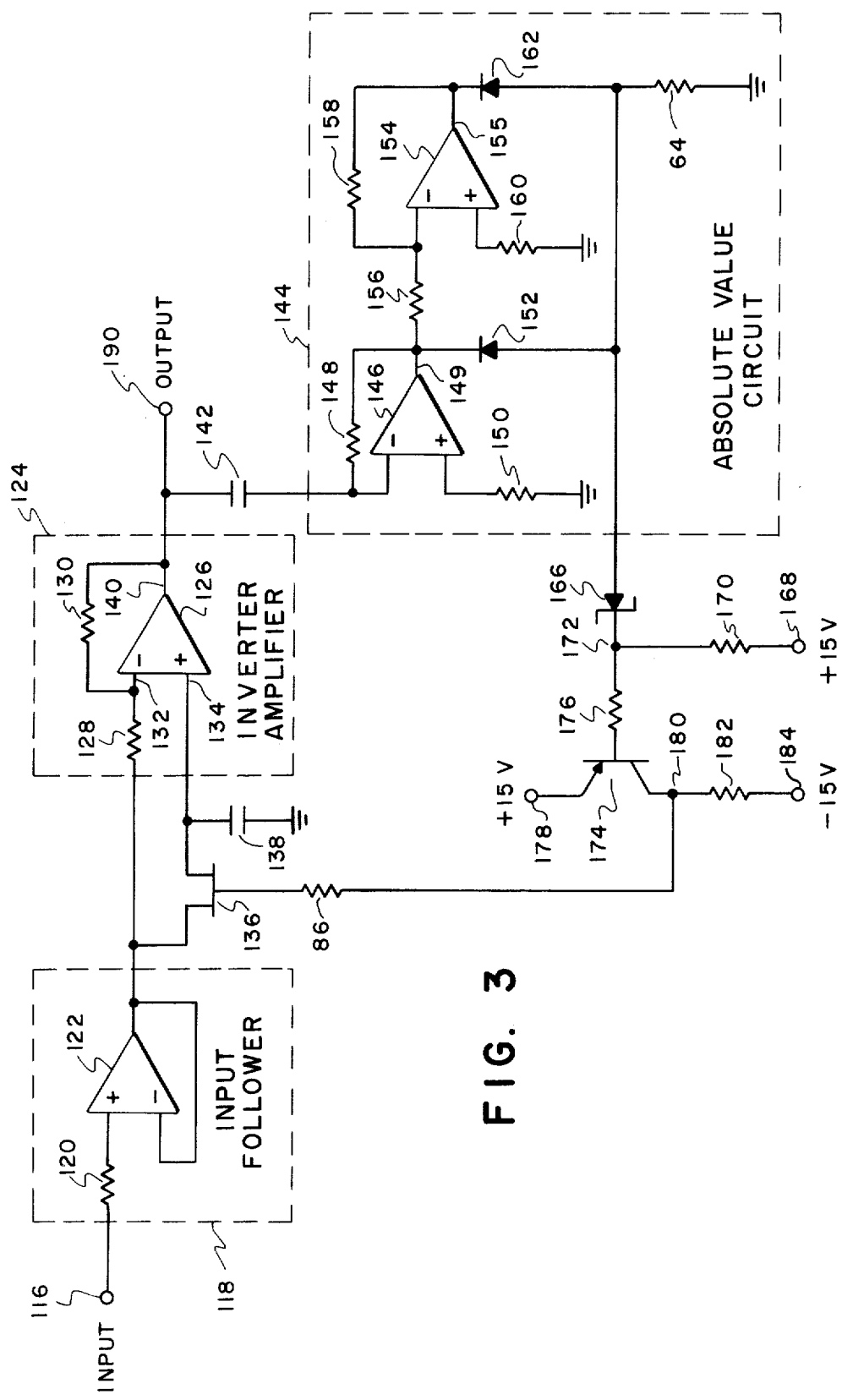
FIG. 3 is a schematic drawing of a circuit embodying the invention.

In FIG. 3 an input signal, such as waveform 22 in FIG. 2A, enters input terminal 116 of the slope change detector circuit. The signal first passes through an input follower 118, which acts as an impedance matcher. The input follower 118 may include a resistor 120 and a differential amplifier 122 connected in the well-known negative feedback amplifier configuration.

After leaving input follower 118, the signal enters the inverter amplifier 124, which may include a differential amplifier 126, an input resistor 128, and a feedback resistor 130, all connected in the negative feedback configuration. Differential amplifier 126 has a negative input terminal 132, positive input terminal 134, and an output terminal 140. The amplifier's amplification factor is, according to feedback principles, the ratio of resistor 130 to resistor 128 and positive input terminal 132 through a field-effect-transistor, or FET, which acts as a variably resistive switch to control signal access to positive input terminal 134. Capacitor 38 connected to both the FET 136 and the positive input terminal 134 acts to hold the charge supplied by the sighal when it enters through FET 136.

Initially FET 136 is in its non-conducting state and capacitor 138 is uncharged. Thus, when signal 22 leaves input follower 118 it reaches only negative input terminal 132. As the signal level begins to rise the signal at output 140 of amplifier 126 is a negative, amplified version of signal 22, since amplifier 126 subtracts the signal at input 132 from a zero signal at input 134.

As the signal at output 140 changes negatively, the current flows through a capacitor 142, and the signal enters an absolute value circuit 144. The absolute value circuit may comprise inverting differential amplifiers 146 and 154 in series circuit respectively with diodes 152 and 162 and temperature compensating resistor 164. Amplifier 146 has associated with it a feedback resistor 148 and a temperature compensating resistor 150. The configuration of amplifier 154 includes an input resistor 156, a feedback resistor 158, and a temperature compensating resistor 160.

The signal appearing at the output 149 of amplifier 146 will be a positively-increasing signal, the inverse of the input signal to the amplifier. This signal enters amplifier 154 and becomes a negatively decreasing signal at output 155 of amplifier 154.

The positively increasing signal at output 149 of amplifier 146 places a reverse voltage across diode 152, and thus a current will not flow through the diode. However, the negatively decreasing signal at output 155 of amplifier 154 would place a forward voltage across diode 162, and a current will thus flow through it. The conducting states of diodes 152 and 162 will be reversed if a negative-going signal initially enters input 116. Regardless of the polarity of a signal at input 116, a current will always flow from ground, through resistor 164, and through either diode 152 or 162. Thus, the current flowing in resistor 164 is the absolute value of the signal emanating from output 140 of amplifier 126.

The signal emanating from absolute value circuit 144 influences the operation of a delay-inducing zener diode 166. When the voltage across resistor 164 increases and becomes negative enough to overcome the threshold voltage of zener diode 166, a delayed current will flow from a positive voltage source 168, through a resistor 170, and through zener diode 166. The delay in the beginning of current flow through zener diode 166 can be altered by providing a zener with a different threshold voltage or by providing a faster increasing voltage across resistor 164. The relatively negative voltage at node 172 will cause a current to flow from a pnp transistor 174 through a resistor 176. The current will cause transistor 174 to enter its conducting state, which will impress a voltage supplied by positive voltage source 178 at node 180, which is above a resistor 182 and a negative voltage source 184. Voltage sources 168, 178 and 184 may be chosen to be compatible with the voltages required for amplifiers 122, 126, 146, and 154. Transistor 174 may also be an npn transistor or other comparable switching device. The positive voltage at node 180 is reflected through a resistor 186, and it causes FET 136 to enter its low resistance, or conducting state.

Before FET 136 begins to conduct, the output signal 28, as shown in FIG. 2D, at output 190 increases from zero toward plus $V_a$ at $t_1$. At time $t_1$ FET 136 begins to conduct and capacitor 138 begins to charge toward the level of the signal then entering input 132 of differential amplifier 126. FET 136 has a small resistance associated with it, and thus the combination of FET 136 with capacitor 138 exhibits a small time constant. As a result, capacitor 138 will not charge directly to the level of the input signal, but will rather follow the input signal as it increases to a maximum at time $t_2$. Thus due to this charging characteristic of capacitor 138, the signal entering terminal 134 of differential amplifier 126 will track the signal entering the terminal 132 after a delay interval determined by zener diode 166. In other words, the signal entering terminal 132 is delayed at least by an amount determined by the time constant of the combination of FET 136 and capacitor 138 whenever FET 136 conducts. Additional delay is introduced by controlling the time that FET 136 begins to conduct with respect to the entry of the signal into terminal 132. If the FET begins to conduct at the same time as signal entry into terminal 132, there is an RC delay. If the FET begins to conduct later, there is an RC delay plus an additional delay. This additional delay is produced by the threshold voltage of zener diode 166 as previously discussed. The resulting signal at output 190 will thus be a two-level wave as shown in FIG. 2D.

While particular embodiments of the invention have been shown and described, it is apparent that changes and modifications may be made without departing from the true spirit and scope of the invention. It is thus the intention of the appended claims to cover all such changes and modifications.

What is claimed is:

1. Apparatus for detecting a change in slope in an electrical signal, comprising: a differential amplifier having a first input terminal connected to the signal source; means connected to a second input of a differential amplifier for accumulating the signal; means connected between the signal source and the accumulating means for controlling signal access to the accumulating means; means connected to the output terminal of the differential amplifier for deriving the absolute value of the output signal; and means connected between the controlling means and the absolute value deriving means for operating the controlling means when the absolute value signal reaches a predetermined level.

2. The apparatus of claim 1 wherein the means for operating the controlling means is a zener diode.

3. The apparatus of claim 2 wherein the means for deriving the absolute value of the differential amplifier output signal comprises: a first inverter amplifier whose input terminal is coupled to the output terminal of the differential amplifier; a first diode connected at one terminal to the output terminal of the first inverter amplifier; a second inverter amplifier whose input terminal is connected to the output terminal of the first inverter amplifier; a second diode connected at one terminal to the output terminal of the second inverter amplifier and the other terminal to the second terminal of the first diode and oriented such that like anodes of the two diodes are connected together.

4. Apparatus for detecting a change in slope in an electrical signal comprising: a differential amplifier having a first input terminal connected to the signal source; a capacitor connected to a second terminal of the differential amplifier; transistor switch means connected on one side to the capacitor and said differential amplifier and on the other side to said signal source; and means comprising a full wave rectifier and a zener diode connected to the full wave rectifier for operating the switch means in response to a predetermined positive or negative signal level appearing at the output terminal of said differential amplifier.

5. A circuit for detecting a change in slope in an electrical signal comprising: a differential amplifier having a first input terminal connected to the signal source; switch means connected between a second input terminal of the differential amplifier and said signal source; and means comprising a full wave rectifier and a zener diode connected to the full wave rectifier for operating the switch means in response to a predetermined signal level at the output terminal of said differential amplifier.

6. A circuit for detecting a change in the slope in an electrical signal comprising: a differential amplifier having a first input terminal connected to the signal source; a capacitor connected to a second terminal of the differential amplifier; a transistor switch connected on one side to the capacitor and the differential amplifier and the other side to the signal source; a zener diode in communication with the gate of the transistor switch; a full wave rectifier having its output connected to the zener diode and its input in communication with the output terminal of the differential amplifier.

7. The circuit of claim 6 further including an inverting transistor whose gate is connected to the zener diode and whose collector communicates with the field effect transistor.

8. The circuit of claim 7 further including a coupling capacitor between the input of the full wave rectifier and the output terminal of the differential amplifier.

9. The circuit of claim 8 wherein the full wave rectifier comprises a first inverting amplifier; a second inverting amplifier connected to the output of the first inverting amplifier; a first diode connected to the output of the first inverting amplifier; a second diode connected to the output of the second inverting amplifier, said second diode having its electrodes oriented with respect to the second inverting amplifier in the same direction as the first diode is oriented with respect to the first inverting amplifier; and a resistor connected on one end of the first and second diodes and to the zener diode and the second end connected to ground potential.

* * * * *